US008208512B2

(12) United States Patent
Brick et al.

(10) Patent No.: US 8,208,512 B2

(45) Date of Patent: Jun. 26, 2012

(54) SURFACE EMITTING SEMICONDUCTOR BODY WITH VERTICAL EMISSION DIRECTION AND STABILIZED EMISSION WAVELENGTH

(75) Inventors: Peter Brick, Regensburg (DE); Wolfgang Diehl, Regensburg (DE); Stephan Lutgen, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 408 days.

(21) Appl. No.: 12/307,120

(22) PCT Filed: Jun. 28, 2007

(86) PCT No.: PCT/DE2007/001148

§ 371 (c)(1), (2), (4) Date: Jun. 16, 2009

(87) PCT Pub. No.: WO2008/000243

PCT Pub. Date: Jan. 3, 2008

(65) Prior Publication Data

US 2010/0014549 A1 Jan. 21, 2010

(30) Foreign Application Priority Data

Jun. 30, 2006 (DE) ......................... 10 2006 030 247
Sep. 8, 2006 (DE) ......................... 10 2006 042 196

(51) Int. Cl.
*H01S 3/13* (2006.01)
*H01S 5/00* (2006.01)

(52) U.S. Cl. ................................ 372/50.124; 372/29.02

(58) Field of Classification Search ............... 372/29.02, 372/29.021, 50.124
See application file for complete search history.

(56) References Cited

U.S. PATENT DOCUMENTS

| | | | | |
|---|---|---|---|---|
| 5,712,865 | A * | 1/1998 | Chow et al. | 372/96 |
| 6,327,293 | B1 | 12/2001 | Salokatve et al. | |
| 7,418,024 | B2 * | 8/2008 | Kim et al. | 372/75 |
| 7,801,197 | B2 * | 9/2010 | Konttinen | 372/50.124 |
| 2004/0013154 | A1 | 1/2004 | Zheng | |
| 2005/0226302 | A1 * | 10/2005 | Lutgen | 372/70 |
| 2005/0226304 | A1 | 10/2005 | Schwarz et al. | |

FOREIGN PATENT DOCUMENTS

| | | |
|---|---|---|
| DE | 10 2004 011 456 | 8/2005 |
| GB | 2 369 929 | 6/2002 |
| WO | WO 02/47223 | 6/2002 |

OTHER PUBLICATIONS

V. Y. Bondarev et al., "E-beam pumped GaInP/A1GaInP MQW VCSEL", 2003 International Conference Indium Phosphide and Related Materials, Conference Proceedings, pp. 182-185, May 12, 2003.*

(Continued)

*Primary Examiner* — Armando Rodriguez

(74) *Attorney, Agent, or Firm* — Cozen O'Connor

(57) ABSTRACT

A surface emitting semiconductor body with a vertical emission direction is specified, which is provided for operation with a resonator and comprises a semiconductor layer sequence with an active region, wherein the semiconductor body is embodied in wavelength-stabilizing fashion in such a way that a peak wavelength of the radiation generated in the active region, in a predetermined operating range of the semiconductor body, is stabilized with respect to changes in the output power of the radiation generated in the active region.

47 Claims, 5 Drawing Sheets

OTHER PUBLICATIONS

M. Kuznetsov et al., "Design and Characteristics of High-Power (0.5-W CW) Diode-Pumped Vertical-External-Cavity Surface-Emitting Semiconductor Lasers with Circular TEM Beams", IEEE Journal of Selected Topics in Quantum Electronics, vol. 5, No. 3, Jun. 1, 1999.

V. Y. Bondarev et al., "E-beam pumped GaInP/AlGaInP MQW VCSEL", 2003 International Conference Indium Phosphide and Related Materials, Conference Proceedings, pp. 182-185, May 12, 2003.

S.W. Corzine et al., "Design of Fabry-Perot Surface-Emitting Lasers with a Periodic Gain Structure", IEEE Journal of Quantum Electronics, vol. 25, No. 6, pp. 1513-1524, Jun. 1, 1989.

* cited by examiner

SURFACE EMITTING SEMICONDUCTOR BODY WITH VERTICAL EMISSION DIRECTION AND STABILIZED EMISSION WAVELENGTH

RELATED APPLICATIONS

This is a U.S. national stage under 35 USC §371 of application No. PCT/DE2007/001148, filed on Jun. 28, 2007.

This application claims the priority of German Patent Applications. 10 2006 030 247.8 filed Jun. 30, 2006 and 10 2006 042 196.5 filed Sep. 8, 2006, the disclosure content of both of which is hereby incorporated by reference.

FIELD OF THE INVENTION

The invention relates to a surface emitting semiconductor body with vertical emission direction.

BACKGROUND OF THE INVENTION

Surface emitting semiconductor lasers with a vertical emission direction are known for example from an article by Kuznetsov et al. (IEEE Journal of Selected Topics Quantum Electronics, Vol. 5, No. 3, May/June 1999, pages 561-573). The spectral position of the peak wavelength of the radiation generated in the active region during operation of such semiconductor lasers is typically dependent on the temperature of the active region. Thus, an increase in the temperature of the active region can bring about a reduced band gap energy, which can cause a shift in the peak wavelength to longer wavelengths. However, in many applications, for instance if the radiation generated by the semiconductor laser is provided for conversion in a nonlinear-optical crystal, a peak wavelength that is as stable as possible is highly advantageous. In a possible method, the peak wavelength can be stabilized by means of regulating the operating temperature of the semiconductor laser. However, such methods are comparatively complicated.

SUMMARY OF THE INVENTION

It is an object of the present invention to specify a surface emitting semiconductor body provided for operation with a resonator, wherein the spectral position of the peak wavelength of the radiation propagating in the resonator or of the radiation coupled out from the resonator is stabilized in a simplified manner with respect to temperature changes of an active region of the semiconductor body that is provided for generating radiation.

In a first embodiment according to the invention, a surface emitting semiconductor body with a vertical emission direction, which is provided for operation with a resonator, comprises a semiconductor layer sequence with an active region and also at least two semiconductor layers arranged outside the active region. In this case, the active region comprises a plurality of quantum structures, wherein a geometrical midpoint is assigned to each quantum structure with regard to its extent along the emission direction. In this case, the geometrical midpoints of the quantum structures, along the emission direction, are arranged at a mean optical distance D with respect to one another, and an optical layer thickness of one of the semiconductor layers arranged outside the active region is detuned in targeted fashion with respect to an integer multiple of half the mean optical distance D.

By means of detuning of this type, a dependence of a peak wavelength of a radiation generated in the active region and provided for amplification in the resonator on a temperature on the active region can advantageously be reduced during operation of the semiconductor body in the resonator. In addition, the peak wavelength can be stabilized with respect to a change in the output power of the radiation generated in the active region.

In a preferred configuration, the semiconductor body is provided for operation in a predetermined operating range.

In a second embodiment of the invention, a surface emitting semiconductor body with a vertical emission direction comprises a semiconductor layer sequence with an active region. In this case, the semiconductor body is embodied in wavelength-stabilizing fashion in such a way that during operation of the semiconductor body in a resonator, a peak wavelength of a radiation generated in the active region, in a predetermined operating range, is stabilized with respect to a change in the output power of the radiation generated in the active region.

The reduced change in the peak wavelength in the event of a change in the output power is achieved by means of a suitable construction of the semiconductor body. It is advantageously possible to dispense with additional elements in the resonator for stabilizing the peak wavelength.

In a preferred configuration of the second embodiment, the semiconductor layer sequence comprises at least two semiconductor layers arranged outside the active region.

In a further preferred configuration of the second embodiment, the active region comprises a plurality of quantum structures, wherein a geometrical midpoint is assigned to each quantum structure with regard to its extent along the emission direction. In this case, the geometrical midpoints of the quantum structures, along the emission direction, are arranged at a mean optical distance D with respect to one another, and an optical layer thickness of one of the semiconductor layers arranged outside the active region is detuned in targeted fashion with respect to an integer multiple of half the mean optical distance.

The semiconductor body is preferably embodied such that physical effects which counteract an increase in the peak wavelength of the radiation generated in the active region of the semiconductor body as the temperature of the active region rises are amplified in targeted fashion. Such effects are for example mode hopping or a change in the refractive indices of semiconductor layers in the event of a change in the charge carrier density in the semiconductor layers during operation of the semiconductor body.

The peak wavelength of the radiation generated in the active region during operation in a resonator can be regarded as stabilized with respect to a change in the output power of the radiation generated in the active region if the change in the peak wavelength with an increase in the temperature of the active region or with the output power of the radiation is smaller than in the case of a semiconductor body which, as described in the article by Kuznetsov et al. mentioned in the introduction is embodied in such a way that all the optical layer thicknesses of the semiconductor layers arranged outside the active region correspond to an integer multiple of a common value, wherein said common value is predetermined by the sought peak wavelength of the radiation generated in the semiconductor body.

Furthermore, the peak wavelength can be regarded as stabilized if the peak wavelength, in the event of a change in the temperature of the active region or in the event of a change in the output power of the radiation generated in the active region, changes more slowly than is the case on account of the change in the refractive indices of the semiconductor materials used in the semiconductor body with the temperature of the active region. In this case, the change in the refractive indices with the temperature is a material-specific value of these semiconductor materials. By way of example, for a conventional semiconductor body based on GaAs, a temperature-induced resonance shift of +0.1 nm/° C. is specified by Kuznetsov et al.

In the context of the invention, a surface emitting semiconductor body with a vertical emission direction is understood to be a semiconductor body in which a radiation generated in the semiconductor body emerges from the semiconductor body predominantly at a surface of the semiconductor body which runs parallel to the semiconductor layers of the semiconductor layer sequence of the semiconductor body. The direction in which the radiation generated in the semiconductor body is predominantly emitted is therefore perpendicular or substantially perpendicular to the semiconductor layers of the semiconductor layer sequence.

In a preferred configuration, the lower limit of the predetermined operating range is formed by the laser threshold of the semiconductor body. In this case, the laser threshold is understood to be that pump power at which the laser activity, that is to say the emission of coherent radiation, commences during operation of the semiconductor body in the resonator.

In a further preferred configuration, the upper limit of the predetermined operating range is formed by an operating point at which the maximum output power is obtained, particularly preferably by an upper limit of the laser activity of the surface emitting semiconductor body. In general, the so-called thermal roll-over of the semiconductor body leads to an upper limit of the laser activity. The thermal roll-over has the effect that a maximum output power of the radiation generated in the active region cannot be exceeded in the event of a further increase in the pump power. The reason for this is thermally induced loss mechanisms in the active region which lead to a discontinuation of the laser activity in the event of an increase in the pump power beyond the operating point of the maximum output power.

Particularly preferably, the predetermined operating range is the entire range of laser activity. The limits of the operating range are therefore the laser threshold and the upper limit of the laser activity.

During operation of the semiconductor body, the pump power can be fed in particular electrically or optically to the active region of the semiconductor body.

In a preferred configuration, the semiconductor body is embodied in such a way that the peak wavelength of the radiation generated in the active region changes by 10 nm or less, particularly preferably by 5 nm or less, in particular by 1 nm or less, in the predetermined operating range.

In a further preferred configuration, two adjacent quantum structures of the active region are separated from one another by a respective barrier. In this case, the quantum structures are provided for generating, preferably coherent radiation. In particular, during operation of the semiconductor body radiation is generated in the quantum structures by means of radiative recombination of quantized electrons with quantized holes. In this case, the emission of the radiation to be amplified in the active region is effected preferably along the emission direction.

In the context of the application, the designation quantum structure encompasses any structure in which charge carriers experience or can experience a quantization of their energy states as a result of confinement.

In particular, the designation quantum structure does not comprise any indication about the dimensionality of the quantization. It therefore encompasses, inter alia, quantum wells, quantum wires and quantum dots and any combination of these structures.

Typically, the extent of a barrier along the emission direction is in this case at least as large as the extent of a quantum structure along the emission direction. In particular, the extent of the barriers is at least twice as large as the extent of the quantum structures, preferably at least five times as large as the extent of the quantum structures.

Particularly preferably, the thickness of the barrier, that is to say the extent of the barrier along the emission direction, is embodied such that the mean optical distance D corresponds approximately to the distance between two adjacent maxima of the intensity of a standing wave field that forms during operation of the semiconductor body in the resonator for the radiation to be amplified in the active region. In this case, the deviation from the mean optical distance D and the distance between two adjacent maxima of the intensity of the standing wave field is typically at most 5%, preferably at most 2%, particularly at most 1%. The smaller this deviation, the nearer the midpoint of each quantum structure can be arranged at a respective one of said maxima of the standing wave field. Thus, it is advantageously possible to increase the amplification for radiation to be amplified in the active region.

In a further preferred configuration, the active region comprises five quantum structures or more, particularly preferably ten quantum structures or more. As the number of quantum structures increases, the absorption of the pump radiation can advantageously be increased during optical pumping of the active region. On the other hand, the thickness of the active region simultaneously increases, whereby the duration of the deposition of the active region increases during the production of the semiconductor body. A number of between 10 and 25 quantum structures inclusive, for example 14 quantum structures, has therefore proved to be advantageous.

In a particularly preferred configuration, the geometrical midpoints of the quantum structures are arranged equidistantly, wherein the optical distance between the geometrical midpoints of two adjacent quantum structures in each case corresponds to the distance between two adjacent maxima of the intensity of a standing wave field in the resonator for the radiation to be amplified in the active region. Thus, the quantum structures of the active region can be arranged particularly precisely at a respective maximum of the intensity of a standing wave field in the resonator for the radiation to be amplified in the active region.

In a preferred development, the active region is embodied as a resonant periodic gain structure (RPG structure), wherein a period of the resonant periodic gain structure is formed by a respective quantum structure and a respective barrier adjoining the latter. The quantum structure, in particular, is in this case preferably embodied identically in all the periods. In this case, in the resonant periodic gain structure, the quantum structure is embodied such that a radiation to be amplified in the active region is amplified in resonant fashion via the quantum structures.

In a further preferred configuration, a quantum structure comprises in each case precisely one quantum layer. This enables a particularly simple and reproducible production of the quantum structure.

In a further preferred configuration, a quantum structure comprises a group of two and up to five quantum layers. The latter can be separated from one another by interlayers. A number of two to five quantum layers is advantageous since the extent of the quantum structure along the emission direction is thus sufficiently small, such that all the quantum layers of a quantum structure can be arranged in the region of a maximum of the standing wave field of the radiation to be amplified.

The mean optical distance D is understood to be the arithmetic mean of the optical path length between the geometrical midpoints of in each case two adjacent quantum structures along the emission direction. In this case, the refractive index of the relevant semiconductor layers for the radiation to be amplified in the resonator should be taken as a basis for the calculation of the optical path length. Half the mean optical distance is designated hereinafter as D/2 for short.

Analogously to this, an optical layer thickness of a semiconductor layer should be understood to mean the optical path length through the semiconductor layer along the emission direction, that is to say the layer thickness multiplied by the refractive index of the semiconductor layer for the radiation to be amplified in the active region.

An optical layer thickness is regarded as detuned in targeted fashion with respect to a predetermined basis value in particular if the deviation of the optical layer thickness from the basis value goes beyond typical deviations, caused for instance by manufacturing tolerances. Accordingly, a layer whose optical layer thickness deviates from the basis value within typical statistical fluctuations should not be regarded as detuned in targeted fashion.

Semiconductor layers whose actual layer thickness deviates from the predetermined layer thickness by less than 1% can be deposited for example during the epitaxial deposition of semiconductor layers, for instance by means of MOVPE or MBE. The deviation of the optical layer thickness can also lie within this range.

A semiconductor layer is referred to hereinafter as detuned positively with respect to a predetermined basis value if its optical layer thickness is greater than the predetermined basis value.

By way of example, any semiconductor layer whose optical layer thickness is detuned in targeted fashion with respect to an integer multiple of D with respect to an odd-numbered multiple of D/2 is referred to hereinafter as detuned positively with respect to an integer multiple of D or, respectively, with respect to an odd-numbered multiple of D/2 if the optical layer thickness is greater than a closest integer multiple of D or, respectively, a closest odd-numbered multiple of D/2.

Analogously to this, a semiconductor layer is referred to as detuned negatively with respect to a predetermined basis value if its optical layer thickness is less than the basis value.

In a preferred configuration, the optical layer thickness of one of the semiconductor layers arranged outside the active region is detuned with respect to an odd-numbered multiple of D/2 relative to D/2 or with respect to an integer multiple of D relative to D by 1% or more and by 45% or less. Particularly preferably, the optical layer thickness of one of the semiconductor layers arranged outside the active region is detuned with respect to an odd-numbered multiple of D/2 relative to D/2 or with respect to an integer multiple of D relative to D by 2% or more and by 35% or less. In particular, the optical layer thickness of one of the semiconductor layers arranged outside the active region is detuned with respect to an odd-numbered multiple of D/2 relative to D/2 or with respect to an integer multiple of D relative to D by 5% or more and by 30% or less.

In a further preferred configuration, the active region is arranged between the semiconductor layers arranged outside the active region. In particular, both semiconductor layers arranged outside the active region are detuned in targeted fashion with respect to an integer multiple of D or with respect to an odd-numbered multiple of D/2.

It is furthermore preferably the case that one of the semiconductor layers arranged outside the active region is larger than an integer multiple of D/2, that is to say detuned positively with respect to D/2, and one of the semiconductor layers arranged outside the active region is smaller than an integer multiple of D/2, that is to say detuned negatively with respect to D/2.

In a further preferred configuration, the semiconductor body has a radiation passage area for radiation to be amplified in the active region. Radiation to be amplified in the semiconductor body can be coupled out from the semiconductor body and be coupled into the semiconductor body through said radiation passage area. Particularly preferably, the radiation to be amplified in the active region passes through the radiation passage area perpendicular to the latter.

In a further preferred configuration, the resonator is formed by means of a Bragg mirror formed in the semiconductor body. The semiconductor layers forming the Bragg mirror can be p-doped, n-doped, intrinsic or substantially undoped. Doped semiconductor layers can serve for injecting charge carriers into the active region.

Preferably, the Bragg mirror is arranged on that side of the active region which is remote from the radiation passage area. In particular, the Bragg mirror is formed with one of the semiconductor layers that are arranged outside the active region and detuned in targeted fashion.

It is furthermore preferably the case that the Bragg mirror comprises further semiconductor layers that are detuned in targeted fashion with respect to an odd-numbered multiple of D/2, in particular with respect to D/2.

In a further preferred configuration, one of the semiconductor layers of the Bragg mirror that are detuned in targeted fashion is detuned with respect to D/2 by at least 1% and at most 45%. Preferably, the detuning with respect to D/2 is at least 2% and at most 35%, particularly preferably at least 5% and at most 25%, for example 8%.

It is furthermore preferably the case that all the semiconductor layers which are arranged on that side of the active region which is remote from the radiation passage area, in particular the semiconductor layers forming the Bragg mirror, are detuned by at least 1% and at most 45%. Preferably, the detuning with respect to D/2 is at least 2% and at most 35%, particularly preferably at least 5% and at most 20%, for example 8%. In particular, all the semiconductor layers which are arranged on that side of the active region which is remote from the radiation passage area, in particular the semiconductor layers forming the Bragg mirror, have a detuning of identical percentage. Thus, the dependence of the peak wavelength of the radiation to be amplified in the active region can be reduced particularly effectively.

In a further preferred configuration, the semiconductor body comprises a window layer adjoining the radiation passage area. Said window layer is preferably formed by one of the semiconductor layers arranged outside the active region and detuned in targeted fashion. A further semiconductor layer can be arranged between the window layer and the active region.

Preferably, one of the semiconductor layers arranged between the radiation passage area and the active region, for example the window layer, has a band gap which is sufficiently large such that radiation to be amplified by the active region is not absorbed or is only slightly absorbed during transmission through said semiconductor layer. Thus, absorption losses of the radiation power to be amplified can be advantageously reduced.

It is furthermore preferably the case that the band gap of one of the semiconductor layers arranged between the radiation passage area and the active region, for example the band gap of the window layer, is larger than that of the barriers in the active region, such that this semiconductor layer can prevent free charge carriers generated in the active region from passing to the radiation passage area. Non-radiative recombination of these free charge carriers at the radiation passage area can thus be largely avoided. As a result, the output power of the radiation to be amplified in the active region can advantageously be increased for the same pump power.

Furthermore, the semiconductor layers arranged between the radiation passage area and the active region can be p-doped, n-doped, intrinsic or substantially undoped. Doped semiconductor layers can serve for injecting charge carriers into the active region.

In a further preferred configuration, the optical layer thickness of at least one of the semiconductor layers arranged between the active region and the radiation passage area, for example the optical layer thickness of the window layer, is detuned with respect to an integer multiple of D relative to D by 1% or more and by 45% or less, preferably by 2% or more and by 35% or less, particularly preferably by 5% or more and by 30% or less. In particular, the optical layer thicknesses of all semiconductor layers arranged between the active region and the radiation passage area are detuned with respect to an integer multiple of D relative to D by 1% or more and by 45% or less, preferably by 2% or more and by 35% or less, particularly preferably by 5% or more and by 30% or less. It is furthermore preferably the case that the optical layer thicknesses of the semiconductor layers arranged between the active region and the window layer are detuned in targeted fashion with respect to the two-fold to five-fold multiple of D inclusive.

In a preferred configuration, the detuning of the semiconductor layers arranged between the radiation passage area and the active region has an opposite sign relative to the detuning of the semiconductor layers which are arranged on that side of the active region which is remote from the radiation passage area, in particular the semiconductor layers of the Bragg mirror. Particularly preferably, the semiconductor layers arranged between the radiation passage area and the active region are detuned positively and the semiconductor layers arranged on that side of the active region which is remote from the radiation passage area, in particular the semiconductor layers of the Bragg mirror, are detuned negatively. Thus, the dependence of the peak wavelength of the radiation to be amplified by the semiconductor body on the temperature of the active region and, consequently, the change in the peak wavelength in the event of a change in the output power of the radiation to be amplified by the semiconductor body can be reduced particularly effectively.

In a preferred configuration, the semiconductor layer sequence of the semiconductor body is produced by means of an epitaxial deposition process, for example by means of MBE or MOVPE, on a growth substrate. The latter can for example contain a III-V semiconductor material such as GaAs or consist of such a material.

Preferably, the quantum layers contain $In_xGa_{1-x}As$ where $0 \leqq x \leqq 1$. An indium content of $0.05 \leqq x \leqq 0.25$ is particularly preferred. InGaAs-containing quantum layers are suitable particularly for generating radiation in the wavelength range of approximately 900 nm to approximately 1.5 μm.

The interlayers and also the barriers can contain $GaAs_{1-y}P_Y$ where $0 \leqq y \leqq 1$, or $Al_zGa_{1-z}As$ where $0 \leqq z \leqq 1$. Values of $0.05 \leqq y \leqq 0.25$ and $0.02 \leqq z \leqq 0.15$ have proved to be particularly advantageous in this case. In particular, a barrier can be formed by a plurality of barrier layers, wherein the barrier layers can contain different materials.

In one preferred development, the semiconductor layer sequence, in particular the active region, is embodied in strain-compensated fashion.

A semiconductor layer sequence is referred to as strain-compensated if the semiconductor layer sequence is formed by compressively strained and by tensile-strained semiconductor layers in such a way that the strains mutually compensate or substantially compensate for one another. This strain compensation makes it possible to deposit comparatively thick semiconductor layer stacks with high crystal quality. Crystal defects, such as dislocations, which occur to an increased extent in highly strained layers, can thus advantageously be avoided.

Particularly preferably, the active region is embodied such that the strain of the quantum layers of a quantum structure is compensated for by the strain of the associated interlayers and a barrier adjoining the quantum structure.

By way of example, the strain of a compressively strained InGaAs-containing quantum layer can be compensated for by a GaAsP-containing barrier or a GaAsP-contained interlayer.

In a further preferred configuration, the resonator is embodied as an external resonator. The external resonator is particularly preferably formed by means of an external resonator mirror. The external resonator mirror is embodied in particular in a manner spaced apart from the semiconductor body. In this case, a free space region is preferably situated between the resonator mirror and the semiconductor body, in which region radiation circulating in the resonator does not pass through any solid-state material.

Particularly preferably, a beam path for radiation circulating in the resonator outside the semiconductor body is free of mode-selecting elements. Complicated mounting of such elements is advantageously unnecessary. Since a stabilization of the peak wavelength can be obtained by means of the suitable targeted detuning of semiconductor layers arranged outside the active region, it is possible to dispense with additional elements within the resonator for stabilizing the peak wavelength. This concerns, in particular, frequency-selective elements such as etalons which are used in conventional lasers for stabilizing the peak wavelength or for selecting a desired mode.

Particularly preferably, the semiconductor body is embodied in wavelength-stabilizing fashion in such a way that during its operation in the resonator the peak wavelength of the radiation to be amplified in the active region changes by 0.5%/100K or less, preferably by 0.2%/100K or less, particularly by 0.1%/100K or less, in the event of a change in the temperature of the active region. Additional elements, arranged outside the semiconductor body in the resonator and provided for wavelength stabilization, are advantageously unnecessary for this.

An increase in the temperature of the active region can occur for example in the event of an increase in the power with which the semiconductor body is pumped. This is caused by pump power which is not converted into the desired laser radiation, but rather as power loss leads to heating of the active region. As a consequence, in the case of a semiconductor body in which the peak wavelength of the radiation generated by the active region is dependent on the temperature of the active region, a change in the output power of the radiation generated during operation of the semiconductor body as a result of a change in the pump power is therefore accompanied by a change in the peak wavelength. In the case of a semiconductor body in which the dependence of the peak wavelength with respect to changes in the temperature of the active region is reduced, it is therefore also possible to reduce the change in the peak wavelength in the event of a change in the output power.

In the case of optical pumping of the active region, for example, the temperature of the active region therefore increases in the event of an increase in the optical pump power.

In the case of electrical pumping of the active region, the increase in the temperature of the active region can be caused by an increase in the current injected into the active region. In the case of a semiconductor body having suitably detuned semiconductor layers arranged outside the active region, it is possible for example to reduce the change in a peak wavelength in the near infrared in the event of a change in temperature of the active region to 0.05 nm/K or less, preferably to 0.02 nm/K or less, particularly preferably to 0.01 nm/K or less.

In a further preferred configuration, a nonlinear-optical element, for example a nonlinear-optical crystal, is arranged in the resonator, in particular between the radiation passage area of the semiconductor body and the external resonator end mirror. Said nonlinear-optical element preferably serves for converting the radiation to be amplified in the resonator into radiation having a different wavelength by means of nonlinear-optical frequency mixing, for instance frequency multiplication. Particularly preferably, at least in part a conversion of non-visible radiation, for example of radiation in the near infrared range, into visible radiation is effected by means of the nonlinear-optical frequency mixing, in particular by means of frequency doubling. By virtue of the arrangement of the nonlinear-optical element within the resonator, a nonlinear-optical radiation conversion can be effected particularly efficiently.

In a preferred configuration, the semiconductor body is provided for electrical pumping of the active region. For this purpose, the semiconductor layers arranged outside the active region are expediently doped, such that charge carriers can be impressed into the active region from both sides of the active region via the semiconductor layers arranged outside the active region. Preferably, a contact is arranged on the prefabricated semiconductor body, said contact being electrically conductively connected to the semiconductor body. A contact is preferably metallic or contains a TCO (transparent conductive oxide) material. In particular, on both sides of the semiconductor body in each case at least one semiconductor layer is electrically conductively connected to a contact, such that a current can be impressed into the semiconductor body when a voltage is applied between the contacts.

In a further preferred configuration, the semiconductor body is provided for optical pumping of the active region. A doping of the semiconductor layer sequence of the semiconductor body, in particular of the semiconductor layers arranged outside the active region, is unnecessary.

In a preferred embodiment variant, the barriers are embodied for absorbing the pump radiation radiated into the semiconductor body from a pump radiation source. Since the extent of the barriers along the emission direction is typically larger than the extent of the quantum structure, a larger proportion of the active region can thus serve for absorption, thereby promoting the absorption of the pump power in the active region.

In an alternative or supplementary embodiment variant, the quantum layers can be embodied for absorbing the pump radiation. It is thereby possible to reduce the energy difference between the photons absorbed in the active region and the emitted photons provided for amplification in the resonator. Thus, the heat introduced into the active region on account of power loss can advantageously be reduced.

Preferably, the pump radiation source is provided for lateral pumping of the semiconductor body, that is to say that the pump radiation generated by the pump radiation source runs parallel or substantially parallel to the radiation passage area of the semiconductor body and thus perpendicular or substantially perpendicular to the radiation to be amplified by the active region of the semiconductor body.

Preferably, the pump radiation source is an edge emitting semiconductor laser structure. By way of example, the pump radiation source can be embodied as an edge emitting broad stripe laser.

However, it is also conceivable for the semiconductor body to be optically pumped on the part of the radiation passage area. In this case, the pump radiation preferably impinges on the radiation passage area perpendicular to the radiation passage area or obliquely, that is to say at an acute angle different from 0° with respect to a normal to the radiation passage area.

In a preferred development, the pump radiation source and the semiconductor body are monolithically integrated, that is to say that the semiconductor body and the pump radiation source are deposited epitaxially on a common growth substrate. Preferably, the pump radiation source and the semiconductor layer sequence are arranged alongside one another on the common growth substrate.

The layer thicknesses of the individual semiconductor layers of the pump laser and of the semiconductor body, respectively, can be set very accurately during the epitaxy, such that a high positioning accuracy of the edge emitting structure with respect to the active region of the vertically emitting semiconductor body is advantageously possible.

In a preferred configuration, the semiconductor body is embedded in wavelength-stabilizing fashion in such a way that the peak wavelength of the radiation to be amplified in the active region of the semiconductor body changes by 5 nm/W or less, preferably by 2 nm/W or less, particularly preferably by 1 nm/W or less, in the event of a change in an optical pump power absorbed in the active region. The spectral position of the peak wavelength of the laser radiation emitted by the semiconductor body in a vertical direction is thus largely independent of the optical pump power. Consequently, the optical pump power can advantageously be varied without the spectral position of the peak wavelength changing significantly. Consequently within the predetermined operating range of the semiconductor body, the output power of the radiation generated by the semiconductor body can be varied, without the peak wavelength changing significantly.

In a preferred configuration, the semiconductor body is arranged on a carrier. The carrier typically serves for mechanically stabilizing the semiconductor layer sequence. The carrier can be formed by the growth substrate on which the semiconductor layer sequence is deposited.

In a preferred development, the carrier is different from the growth substrate of the semiconductor layer sequence. In contrast to the growth substrate, the carrier advantageously does not have to satisfy the high requirements with regard to the crystalline purity, but rather can be selected with regard to other criteria, such as, for example, mechanical stability, optical, thermal or electrical properties.

It is furthermore preferably the case that the carrier is arranged on a heat-conducting element. In particular, a side of the carrier that is remote from the semiconductor body is thermally conductively connected to the heat-conducting element. A thermally conductive connecting layer can be arranged between the carrier and the semiconductor body. Said connecting layer can be a solder connection, for example. As an alternative, the semiconductor body can be clamped with the carrier onto the heat-conducting element.

The heat generated by power loss during the operation of the semiconductor body can be dissipated via the carrier from the semiconductor body into the heat-conducting element. In this case, the dominant physical effect for the heat dissipation is the heat conduction. The heat-conducting element preferably contains one of the following materials: copper, diamond, silver, $Al_2O_3$, AlN, SiC, Ge, GaAs, BN, copper-diamond. The carrier can also contain one of these materials.

In a preferred embodiment, the growth substrate is partly or completely stripped away. In this case, the stripping away can be effected over the whole area or in regions. Preferably, the stripping-away takes place in a mechanical and/or chemical process.

In a further preferred configuration, a semiconductor laser component comprises the surface emitting semiconductor body and the resonator. In particular, the semiconductor laser component is embodied as a semiconductor disk laser. Disk lasers typically have a comparatively large extent in a lateral direction relative to the extent in the vertical emission direction perpendicular thereto. Heat arising in the active region during the operation of the disk laser can predominantly be dissipated from the semiconductor body along the emission direction, preferably via the carrier. In the lateral extent, the temperature of the active region is therefore comparatively homogeneous. This advantageously enables a high beam quality of the radiation to be amplified in the semiconductor body.

In a preferred development, the semiconductor component is provided for optically pumping a laser, for example a fiber laser, a solid-state laser or a semiconductor laser. A semiconductor laser component having a stabilized peak wavelength of the radiation to be amplified in the semiconductor body is particularly suitable for optically pumping a laser since the peak wavelength can be tuned largely independently of the temperature of the active region to an absorption spectrum of the laser to be pumped. A decreasing efficiency of the optical pumping by the semiconductor laser component on account of a change in the peak wavelength of the radiation to be amplified by the semiconductor body can thus largely be avoided.

In a further preferred development, the semiconductor laser component is provided for operation in a display device, in particular a projection arrangement. Particularly preferably, the semiconductor laser component is provided for generating green light, in which case, by way of example, radiation generated in the semiconductor body is converted into green light by means of frequency doubling.

In a departure from the previous description of the invention it is also conceivable for a layer that is arranged outside the active region and is detuned in targeted fashion with respect to an integer multiple of D/2 to be embodied as a dielectric layer arranged on the semiconductor body on the part of the radiation passage area.

In this case, the dielectric layer is preferably deposited on the prefabricated semiconductor body, for example by means of sputtering or vapor deposition.

A stabilization of the peak wavelength of the radiation generated in the active region of the semiconductor body with respect to a change in the output power and/or with respect to a change in the temperature of the active region can in this case be effected by means of the targeted detuning of the dielectric layer instead of the targeted detuning of a semiconductor layer arranged outside the active region.

In particular, it is thus possible to dispense with a semiconductor layer that is arranged between the active region and the radiation passage area of the semiconductor body and is detuned in targeted fashion with respect to an integer multiple of D/2.

DETAILED DESCRIPTION OF THE DRAWINGS

Elements that are identical, of identical type and act identically are provided with identical reference symbols in the figures.

Figure 1:
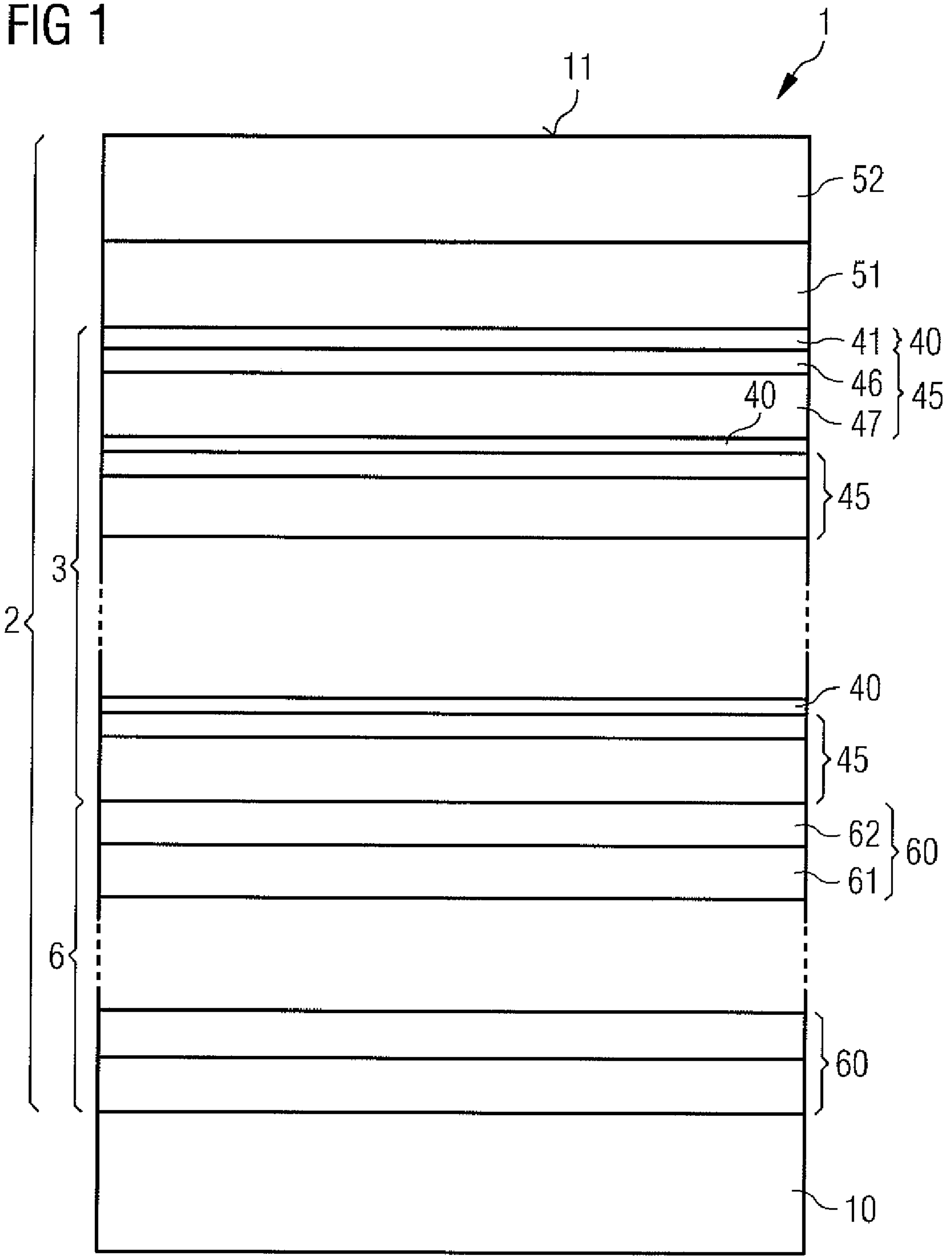
FIG. 1 shows a schematic sectional view of a first exemplary embodiment of a semiconductor body according to the invention.

FIG. 1 schematically shows a sectional view of a semiconductor body 1 according to the invention. The semiconductor body comprises a semiconductor layer sequence 2 having an active region 3. Furthermore, the semiconductor body has a radiation passage area 11 through which passes radiation that is generated in the active region 3. The semiconductor body is arranged on a carrier 10, wherein the carrier is formed, for example, by a GaAs growth substrate for the semiconductor layer sequence 2.

The active region 3 comprises a plurality of quantum structures 40, preferably 5 quantum structures or more, particularly preferably 10 quantum structures or more, for example 14 quantum structures. A sufficiently large number of quantum structures is advantageous since the output power of the radiation generated in the active region can thereby be increased. Since, as the number of quantum structures increases, during production the deposition duration also increases, the number of quantum structures is typically 30 or less, preferably 20 or less.

Two adjacent quantum structures 40 are in each case separated from one another by a barrier 45. Here the barrier 45 comprises in each case a first barrier layer 46 and a second barrier layer 47. Preferably, the barrier 45 is at least as thick as the quantum structure, preferably at least twice as thick as the thickness of the quantum structure, particularly preferably at least five times as thick as the thickness of the quantum structure.

A quantum structure 40 is formed by a quantum layer 41. The geometrical midpoint of the quantum structure 40 with regard to the extent thereof along the emission direction thus corresponds to the geometrical midpoint of the quantum layer 41 along the emission direction.

The quantum layer 41 contains $In_{0.2}Ga_{0.8}As$, for example, and is 10 nm thick. In this case, the first barrier layer 46 is formed by a 50 nm wide layer of GaAsP. This barrier layer is designed to compensate for the strain of the compressively strained InGaAs quantum layer 41.

In this case, the thickness of the first barrier layer 46 is preferably chosen such that the strain of the barrier layer is equal or substantially equal in magnitude to the strain of the quantum layer, but with an opposite sign, such that these strains mutually compensate for one another. The first barrier layer 46 is arranged on that side of the quantum layer 41 which is remote from the radiation passage area. As an alternative, the barrier layer can be arranged on that side of the quantum layer which faces the radiation passage area. As a further alternative, the quantum layer 41 can be embedded for example between two GaAsP-containing first barrier layers 46, wherein the thickness of the two GaAsP-containing first barrier layers, with in each case approximately 25 nm, is once again chosen such that the strain of the two GaAsP-containing first barrier layers 46 compensates for that of the quantum layer 41.

By way of example, the second barrier layer 47 is formed by AlGaAs and 92 nm thick. This ternary semiconductor compound is distinguished by the fact that the lattice constant increases only very slowly as the Al contact increases. AlGaAs layers therefore grow on a GaAs growth substrate approximately without being strained, which makes it possible to deposit thick layers with high crystal quality. The distance between the geometrical midpoints of two adjacent quantum structures 40 along the emission direction can thus be set in a simple manner by way of the thickness of the second barrier layer 47.

The semiconductor body 1 is provided for operation in a resonator. Typically, the mean distance D between the geometrical midpoints of two adjacent quantum structures 40 deviates by less than 5%, preferably by less than 2%, particularly preferably by less than 1%, from the distance between two adjacent maxima of the standing wave field that forms during the operation of the semiconductor body 1 in the resonator. Thus, the geometrical midpoint of each quantum structure 40 can be arranged near a maximum of the standing wave field. As a result, during the operation of the semiconductor body, it is advantageously possible to optimize the gain for radiation to be amplified in the active region 3. In this case, the distance between two adjacent maxima of the standing wave field corresponds to half the peak wavelength in the semiconductor body of the radiation that circulates in the resonator and is to be amplified in the semiconductor body.

Preferably, the geometrical midpoints of the quantum structures 40 are arranged at an equidistant distance, and hence a distance corresponding to the mean distance D. In particular, D in turn deviates as little as possible from the distance between two adjacent maxima of the standing wave field. Thus, the geometrical midpoint of each quantum structure 40 can be arranged precisely at the maximum of the standing wave field.

The active region of the exemplary embodiment shown in FIG. 1 is provided for generating laser radiation having a peak wavelength of approximately 1060 nm.

It goes without saying that material compositions and layer thicknesses of the semiconductor layers of the active region 3 are not restricted to the values specified in this exemplary embodiment. Radiation having a different peak wavelength, for example in the near infrared, can also be generated by suitable variation of the material compositions and layer thicknesses.

In particular, the quantum layer 41 can contain $In_xGa_{1-x}As$ where $0 \leqq x \leqq 1$, preferably where $0.05 \leqq x \leqq 0.25$. With a higher In content, the band gap decreases, for example, such that semiconductor bodies 1 for generating radiation having a higher peak wavelength are also possible.

The first barrier layer 46 can contain $GaAs_{1-y}P_Y$ where $0 \leqq y \leqq 1$, preferably where $0.05 \leqq y \leqq 0.25$. The second barrier layer 47 can contain $Al_zGa_{1-z}As$, where $0 \leqq z \leqq 1$, preferably where $0.02 \leqq z \leqq 0.2$.

In this case, the material compositions specified for the quantum structure and the barrier respectively comprise in particular the binary semiconductor crystals GaAs, InAs, GaP and AlAs, and the ternary semiconductor crystals InGaAs, AlGaAs and GaAsP that can be formed therefrom.

As an alternative, the active region can be formed by lattice-matched layers such that strain compensation is not required. The second barrier layer 47 can then be dispensed with.

By way of example, an active region for which strain compensation is not necessary can be formed by a GaAs quantum layer and an $Al_zGa_{1-z}As$ barrier where $0 \leqq z \leqq 1$.

Other III-V semiconductor materials, for example InP or GaSb and also ternary or quaternary semiconductor crystals which can be formed with GaAs, GaP, InP, AlAs or InAs, can also be used as materials for the semiconductor layer sequence 2, in particular for the active region 3.

Outside the active region, the semiconductor layers that form a Bragg mirror 6 are arranged on that side of the active region 3 which is remote from the radiation passage area 11. This Bragg mirror functions as a mirror of the resonator. The Bragg mirror comprises 26 semiconductor layer pairs 60, where the number of semiconductor layer pairs can also deviate from this value. A value of between 10 and 40 inclusive is typical of the number of semiconductor layer pairs. As a result, it is possible to achieve a sufficiently high reflectivity of the Bragg mirror for radiation to be amplified in the resonator in conjunction with a sufficiently short deposition duration of the Bragg mirror during production.

In the semiconductor layer pair 60, one semiconductor layer 61 is formed by GaAs and one semiconductor layer 62 is formed by AlAs. With these materials the Bragg mirror 6 can be embodied in a particularly efficient manner since the refractive indices of these two materials differ to a comparatively great extent with a similar lattice constant. However, it is also conceivable for at least one of the layers to contain a ternary AlGaAs material or some other semiconductor material, in particular one of the materials that can be used for the active region 3.

The thickness of the semiconductor layer 61 is 72 nm and the thickness of the semiconductor layer 62 is 85 nm. The optical layer thicknesses that result therefrom for the semiconductor layers 61 and 62 are detuned in targeted fashion with respect to D/2. For both layers of the semiconductor layer pairs 60, the optical layer thicknesses are approximately 8% smaller than D/2. As a result, the dependence of the peak wavelength of the radiation to be amplified in the active region on the temperature of the active region can be reduced particularly efficiently.

Typically, the optical layer thicknesses of all the semiconductor layers of the Bragg mirror 6 are detuned in targeted fashion with respect to D/2, in particular by the same percentage. However, it can also suffice if not all the semiconductor layers of the Bragg mirror 6 are detuned. In particular, semiconductor layers of the Bragg mirror which are arranged at a comparatively large distance from the active region need not necessarily be detuned in targeted fashion with respect to D/2 or an integer multiple of D/2. One or a plurality of semiconductor layers of the Bragg mirror can accordingly have an optical layer thickness of D/2 or an odd-numbered multiple of D/2.

The detuning of the detuned semiconductor layers of the Bragg mirror 6 can deviate from 8%. Preferably, the deviation of the optical layer thickness of the detuned layers from D/2 is 1% or more and 45% or less. In particular, a range of between 2% and 35% inclusive is advantageous. A detuning of between 5% and 20% inclusive is particularly preferred.

The semiconductor layers of the Bragg mirror 6 can be p-doped, n-doped or undoped. Doped semiconductor layers are particularly advantageous if the semiconductor body 1 is provided for electrical pumping of the active region 3. Thus, charge carriers can be injected into the active region via the Bragg mirror. In the case of a semiconductor body which is provided for optical pumping of the active region, a doping of the semiconductor layers of the Bragg mirror 6 can be dispensed with.

A window layer 52 is arranged outside the active region, said window layer forming the radiation passage area 11. The window layer 52 contains $In_{0.5}Ga_{0.5}P$ and has a thickness of 537 nm. A further semiconductor layer 51 is arranged between the window layer and the active region 3. The semiconductor layer 51 contains $Al_{0.10}Ga_{0.09}As$ and is 333 nm thick.

The band gap of the window layer 52 is so large that the window layer is transparent or substantially transparent to radiation to be amplified in the active region. Thus, absorption-governed losses of radiation to be amplified in the resonator can advantageously be minimized.

Furthermore, the band gap of the window layer 52 is preferably larger than that of the semiconductor layers within the active region. As a result, the window layer can prevent free charge carriers generated in the active region from passing to the radiation passage area 11. Non-radiative recombination of said free charge carriers at the radiation passage area can thus largely be avoided, while a radiative recombination of said charge carriers within the active region can be promoted. As a result, advantageously the output power of the radiation to be amplified in the active region can be increased for the same pump power.

The optical layer thickness of the window layer 52 is 3.26 times D and is thus detuned relative to D by 26% with respect to the nearest integer multiple of D. The optical layer thickness of the semiconductor layer 51 is 2.16 times D and is thus detuned positively relative to D by 16% with respect to 2*D. As a result, the peak wavelength of the radiation to be amplified during the operation of the semiconductor body can be stabilized particularly effectively with respect to changes in the temperature of the active region.

The optical layer thicknesses and also the detuning of the semiconductor layers between the active region 3 and the radiation passage area 11 can, of course, deviate from 16% or 26%. Preferably, the optical layer thickness of at least one of the detuned semiconductor layers arranged between the radiation passage area and the active region, for example of the window layer 52, is detuned relative to D by 1% or more and 45% or less with respect to an integer multiple of D. Particularly preferably, the detuning of the semiconductor layers lies between 2% and 35% inclusive. In particular, the detuning can be between 5% and 30% inclusive.

The optical layer thicknesses of the semiconductor layers arranged between the active region 3 and the radiation passage area 11 preferably amount to two to five times D or are detuned in targeted fashion with respect to two to five times D. Optical layer thicknesses in this range have proved to be particularly advantageous for a stabilization of the peak wavelength.

The semiconductor layers arranged between the active region 3 and the radiation passage area 11 can also have thicknesses which correspond to an odd-numbered multiple of D/2 or are detuned in targeted fashion with respect to the odd-numbered multiple of D/2. By way of example, a semiconductor layer having a thickness corresponding to an odd-numbered multiple of D/2 can have the effect of an antireflection layer, such that it is possible to reduce undesired reflections at the radiation passage area 11 of the radiation to be amplified in the active region 3 upon emergence from the semiconductor body or upon entry into the semiconductor body on the part of the radiation passage area.

Preferably, all the semiconductor layers which are arranged between the active region and the radiation passage area are detuned in targeted fashion with respect to an integer multiple of D. However, for a wavelength stabilization it can also suffice if the optical layer thickness of one or of a plurality of the semiconductor layers arranged between the active region and the radiation passage area deviates from an integer multiple of D.

The detuning of the semiconductor layers arranged between the radiation passage area and the active region has an opposite sign with respect to the detuning of that side of the active region which is remote from the radiation passage area. This has proved to be particularly advantageous for a reduction of the dependence of the peak wavelength on the temperature of the active region. In a departure from this, a targeted detuning of the semiconductor layers with the same sign, that is to say positively detuned semiconductor layers on both sides of the active region or negatively detuned semiconductor layers on both sides of the active region, can also result in a reduction of the dependence of the peak wavelength on the temperature of the active region.

Figure 2:
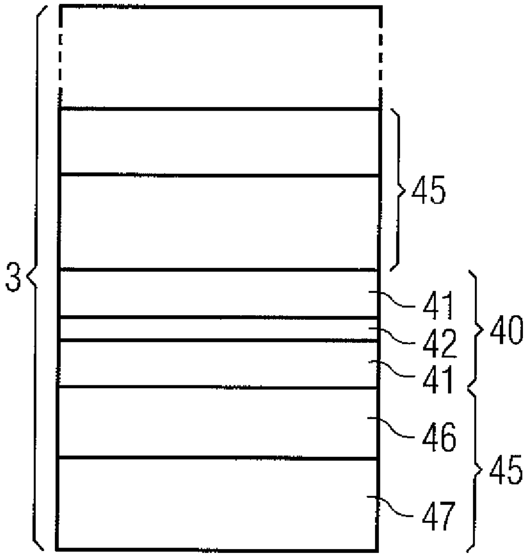
FIG. 2 shows a schematic sectional view for an alternative embodiment of the active region of the first exemplary embodiment.

FIG. 2 shows a schematic sectional view for an alternative embodiment of an active region 3 of the first exemplary embodiment. In this case, the active region differs essentially in the construction of the plurality of quantum structures 40, of which one quantum structure is illustrated by way of example. The quantum structure 40 comprises two quantum layers 41. These quantum layers are separated from one another by an interlayer 42. A barrier 45 is once again formed by a first barrier layer 46 and a second barrier layer 47. The material composition of the layers of the active region can be embodied in the manner described in connection with FIG. 1. In particular, the interlayer can have the same composition as the first barrier layer 46 or as the second barrier layer 47.

As an alternative, a quantum structure 40 can also have more than two quantum layers 41. Preferably, the number of quantum layers per quantum structure is less than or equal to 5, particularly preferably less than or equal to 3. Given a sufficiently small number of quantum layers per quantum structure it is possible to arrange all the quantum layers of a quantum structure in the region of a maximum of the standing wave field that forms during the operation of a semiconductor body in the resonator, as a result of which advantageously all the quantum layers 41 can contribute particularly well to the amplification of the radiation.

Figure 3:
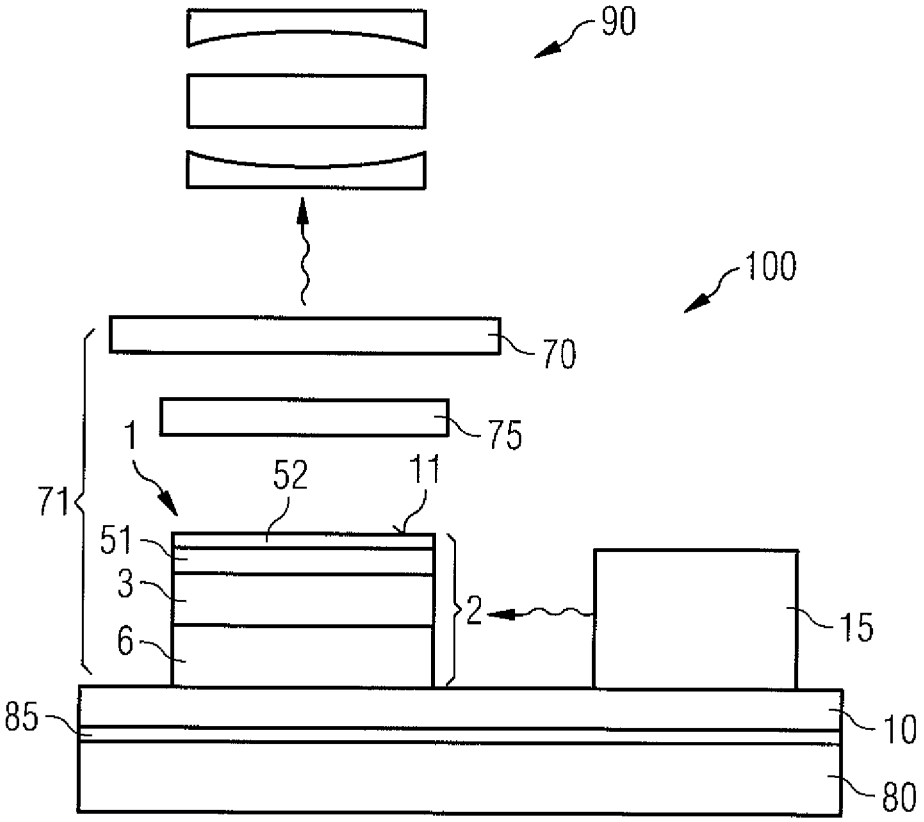
FIG. 3 shows a schematic sectional view of a further exemplary embodiment of a semiconductor body according to the invention.

FIG. 3 schematically shows a sectional view of an exemplary semiconductor laser component 100 comprising a semiconductor body 1 according to the invention. The semiconductor body is provided for optical pumping and comprises a semiconductor layer sequence 2 that can be embodied in the manner described in connection with FIG. 1 and FIG. 2.

The semiconductor laser component 100 is embodied as a semiconductor disk laser. As usual in disk lasers, the lateral extent of the semiconductor body, that is to say the extent in the plane of the radiation passage area 11, is typically larger than the extent in the direction perpendicular thereto, representing the direction of the radiation to be amplified during the operation of the semiconductor body.

The heat arising in the active region during the operation of the semiconductor body 1 is predominantly dissipated in the direction perpendicular to the radiation passage area via the carrier 10. It is thus possible to obtain a comparatively homogeneous temperature distribution in the active region in a lateral direction. This enables a good beam quality of the radiation emitted by the semiconductor laser component with comparatively high pump powers.

A pump radiation source 15 is formed by an edge emitting semiconductor laser, which is monolithically integrated with the semiconductor body 1. That is to say that the semiconductor body 1 and the semiconductor laser 15 are deposited on a common growth substrate. In this case, the semiconductor layer sequence 2 described in connection with FIG. 1 and the edge emitting semiconductor laser are arranged in a manner spaced apart from one another on the common growth substrate serving as carrier 10. The optical pumping is therefore effected laterally, that is to say parallel or substantially parallel to the radiation passage area 11.

The semiconductor body is fixed on a heat-conducting element 80 by means of a connecting layer 85. Heat generated during the operation of the semiconductor body can be dissipated from the semiconductor body 1 into the heat-conducting element, which can be embodied as a heat sink. The heat-conducting element preferably consists of a material having a high thermal conductivity or contains at least one such material. Particularly suitable materials are for example copper, diamond, aluminum nitride or silicon carbide.

The connecting layer can be embodied in thermally and/or electrically conductive fashion. In particular, the connecting layer 85 can enable a mechanically stable and permanent connection of the carrier to the heat-conducting element. By way of example, the connecting layer 85 can contain an adhesive or a solder. As an alternative, the semiconductor body 1 can be clamped with the carrier 10 onto the heat-conducting element 80. The connecting layer 85 can be dispensed with in this case.

A monolithic integration of the pump radiation source 15 and the semiconductor body is not obligatory, however. Rather, the pump radiation source can also be fabricated separately and be arranged for example on the heat-conducting element 80.

The active region 2 need not necessarily be pumped laterally. The pump radiation source can for example also be arranged in such a way that the pump power made available by the pump radiation source is coupled into the semiconductor body 1 through the radiation passage area perpendicular to the radiation passage area or at an acute angle with respect to a normal to the radiation passage area 11.

A resonator 71 is formed by the Bragg mirror 6 and an external resonator mirror 70, the radiation to be amplified by the active region 3 circulating in said resonator. The external resonator mirror forms a resonator end mirror, at which said radiation is partly coupled out. The external resonator mirror is embodied in a manner spaced apart from the semiconductor body, such that the radiation circulating in the resonator passes through a free space region between the radiation passage area 11 of the semiconductor body 1 and the external resonator mirror.

A beam path in the resonator 71 and outside the semiconductor body 1 is preferably embodied such that it is free of additional, mode-selecting elements. Such elements provided for mode selection are not necessary on account of the embodiment of the semiconductor body described in connection with FIG. 1 for a stabilization of peak wavelength. In particular, it is possible to dispense with an element used in targeted fashion for frequency selection such as an etalon within the resonator.

Optionally, as shown in FIG. 3, a nonlinear-optical element 75 can be arranged in the resonator. This element preferably serves for the conversion of radiation to be amplified in the active region 3 by means of nonlinear-optical processes such as frequency multiplication, summation or differential frequency generation.

The nonlinear-optical element can be embodied as a nonlinear-optical crystal. Preferred crystals are for example $KNbO_3$, $BaNaNbO_{15}$, $LiIO_3$, $KTiOPO_4$ (KTP), $LiNbO_3$, $LiB_3O_5$ and $\beta$-$BaB_2O_4$ (BBO).

Particularly preferably, the nonlinear-optical element serves for frequency doubling of the radiation to be amplified in the active region 3. By way of example, radiation in the near infrared range can be converted at least partly into visible light by means of nonlinear-optical processes. By way of example, a radiation of 1060 nm to be amplified in the active region can be converted into green light having the wavelength of 530 nm by means of frequency doubling.

The pump radiation source 15 can be provided for continuous wave operation or for pulsed operation. Pulsed operation has the advantage that the output power of the pump radiation source increases during the pulse. This is particularly advantageous if the radiation to be amplified in the active region 3 is provided for conversion by means of a nonlinear-optical process since this increases the efficiency of the nonlinear-optical process and thus also the power of this converted radiation averaged over time.

In the active region, the barriers 45 are provided for the absorption of the radiation of the pump laser. Since the barriers are typically wider than the quantum layers, it is thereby possible to increase the absorption of the pump power in the active region. As an alternative, however, the quantum structures 40 can also be provided for the absorption of the pump radiation. In this case, the difference between the photon energy of the pump radiation and the energy of the photons of the radiation to be amplified in the active region 3 can be reduced, whereby the heating of the active region during the operation of the semiconductor body 1 can advantageously be reduced.

In FIG. 3, the semiconductor body 1 serves for optical pumping of a laser 90. Such a laser can be for example a solid-state laser, a fiber laser or a semiconductor laser. In this case, the fundamental radiation of the radiation to be amplified in the active region of the semiconductor body and/or a radiation generated by a suitable nonlinear-optical process by means of the nonlinear-optical element 75 can serve as pump radiation.

As an alternative to the example shown in FIG. 3, the carrier 10 can be different from the growth substrate. The latter can be thinned or completely removed, which can be effected over the whole area or in regions. Particularly in the case of growth substrates having a comparatively low thermal conductivity, such removal is advantageous since the heat arising in the active region during the operation of the semiconductor body can be better dissipated into the heat-conducting element 80.

Figure 4:
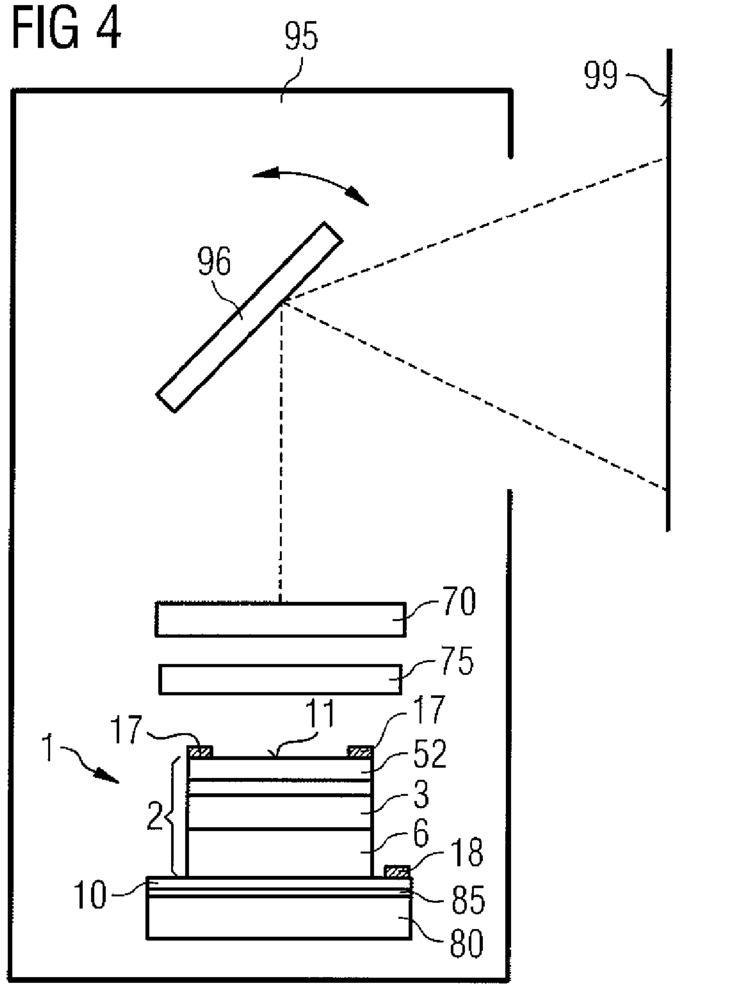
FIG. 4 shows a schematic sectional view of a further exemplary embodiment of a semiconductor body according to the invention.

FIG. 4 shows a semiconductor body 1 according to the invention which is provided for operation in a display device 95, embodied as a projection arrangement. A resonator is formed by a Bragg mirror 6 and an external resonator end mirror 70. Furthermore, a nonlinear-optical element 75 is situated in the resonator, as already described in connection with FIG. 3. In this example, the nonlinear-optical element is provided for the frequency doubling of the radiation that propagates in the resonator and is to be amplified in the active region 3, wherein a radiation generated in the active region with a peak wavelength of 1060 nm is converted into green light having the wavelength 530 nm.

This green light impinges on a deflection optical unit 96, which can preferably be moved about two axes perpendicular to one another. By means of the deflection optical unit, the frequency-doubled radiation emerging from the coupling-out mirror can be directed in targeted fashion onto a predetermined location of a projection plane 99, wherein the position of the predetermined location is preferably varied sequentially in raster-like fashion on the projection plane. Preferably, the projection plane 99 is additionally illuminated by a red and a blue emitting laser device (not shown) such that a color image can be represented by suitable superposition of these three beams on the projection plane.

The semiconductor body 1 is provided for electrical pumping of the active region 3. A first contact 17 and a second contact 18 are provided for injecting charge carriers into the active region on both sides. In this case, the first contact 17 is in particular electrically conductively connected to a window layer 52 arranged outside the active region.

The second contact 18 is electrically conductively connected to the carrier 10. The carrier is arranged on the heat-conducting element 80 by means of the connecting layer 85, wherein a growth substrate for a semiconductor layer sequence 2 has been removed. The contacts 17 and 18 preferably contain a metal and are particularly preferably embodied in metallic fashion. Preferred materials are for example Ni, Cu, Au, Ag, Al or Pt.

The first contact 17 is preferably embodied such that radiation to be amplified by the active region can emerge at the radiation passage area 11. By way of example, the first contact can comprise a cutout, such that the radiation passage area of the semiconductor body is uncovered in the region of the cutout and the radiation can emerge from the semiconductor body 1 in this region.

As an alternative, the first contact 17 can be formed by a material transparent to radiation to be amplified in the active region. By way of example, the contact can contain a TCO material (transparent conductive oxide), for instance ITO (indium tin oxide), or consist of such a material. In this case, the first contact can also cover the radiation passage area 11 over the whole area. As a result, the charge carriers can advantageously be injected into the active region 3 particularly uniformly over the lateral extent of the semiconductor body 1.

The semiconductor layer sequence 2 can be embodied in the manner described in connection with FIG. 1 and FIG. 2. This concerns in particular the targeted detuning of the semiconductor layers arranged outside the active region. The semiconductor layers arranged between the radiation passage area 11 and the active region 3 and also the semiconductor layers of the Bragg mirror 6 are preferably doped in order to enable charge carriers to be injected into the active region via the contact 17 and the contact 18, respectively. Particularly preferably, the semiconductor layers of the Bragg mirror are n-doped and the semiconductor layers arranged between the radiation passage area 11 and the active region 3 are p-doped, or vice versa. It is furthermore preferably the case that the active region 3 is intrinsically doped. The semiconductor body 2 can therefore have a pin-diode structure.

It goes without saying that an optically pumped semiconductor body according to the invention as described in connection with FIG. 3 can also be embodied for operation with a projection arrangement.

Figure 5:
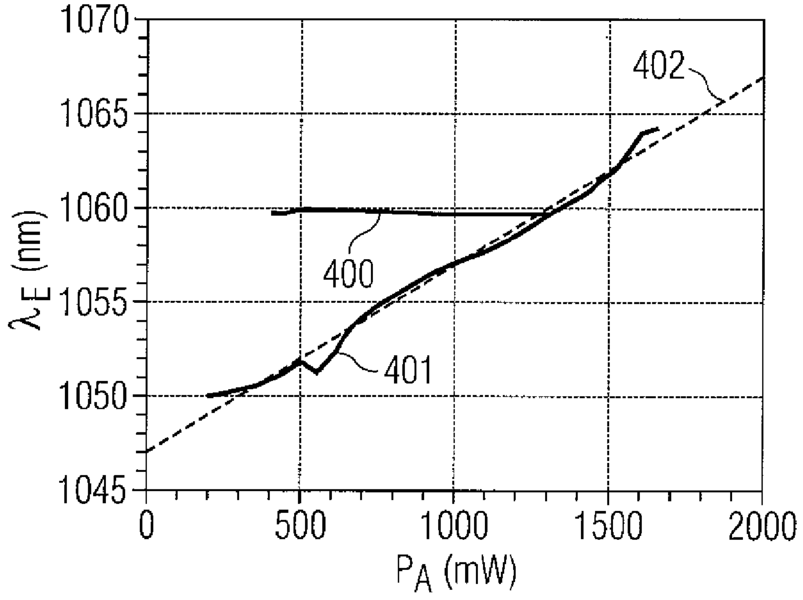
FIG. 5 shows a result of a measurement of the peak wavelength $\lambda_E$ of the radiation generated in a semiconductor body according to the invention during operation in a resonator as a function of the pump power $P_A$ absorbed in the active region compared with the result of a corresponding measurement at a conventional semiconductor body.

A result of a measurement of the peak wavelength $\lambda_E$ of the radiation generated in an active region of a semiconductor body according to the invention as a function of the pump power $P_A$ absorbed in the active region is shown by means of a curve 400 in FIG. 5. In this case, the semiconductor body is embodied in the manner described in connection with FIG. 1. The semiconductor body was operated in a resonator 71, with a resonator end mirror being formed by an external resonator mirror 70 as shown in FIG. 3. Moreover, the semiconductor body is arranged on a heat-conducting element 80 serving as a heat sink. The temperature of the heat sink was kept constant during the measurement.

The result of a corresponding measurement at a conventional semiconductor body is illustrated for comparison by a curve 401. This conventional semiconductor body differs from a semiconductor body according to the invention essentially in that none of the semiconductor layers arranged outside the active region is detuned in targeted fashion with respect to an integer multiple of D/2.

The curve 401 shows, over wide ranges of the absorbed pump power, a continuous increase in the peak wavelength as the absorbed pump power increases. A curve 402 illustrates the trend of the increase in the peak wavelength. The gradient of this curve corresponds to an increase in the peak wavelength of 10 nm/W. Given a thermal resistance of the semiconductor layers arranged between the active region and the heat sink of 100K/W, this corresponds to a change in the peak wavelength in the case of a change in the temperature of the active region of 0.1 nm/K.

Such a change in the peak wavelength with the temperature of the active region is typical of conventional semiconductor bodies. The reason for this is, inter alia, the decrease in the band gap of the semiconductor layers as the temperature increases. This effect can bring about a change in the peak wavelength of typically 0.3 nm/K for example in the case of GaAs-containing semiconductor material. Moreover, a change in the refractive indices of the semiconductor layers with the temperature of the active region leads to an increase in the peak wavelength. By way of example, in the case of GaAs-containing semiconductor material, the resultant increase in the peak wavelength is typically approximately 0.06 nm/K. During operation of conventional GaAs-containing semiconductor bodies in a resonator, the increase in the peak wavelength is therefore typically at least 0.06 nm/K if measures for wavelength stabilization are not implemented.

By contrast, the curve 400 runs substantially horizontally, that is to say that the peak wavelength changes by less than 0.5 nm in the entire range of an absorbed pump power of between approximately 400 nm and approximately 1300 nW. This is less than 0.05% relative to the peak wavelength of 1060 nm. The peak wavelength is thus approximately independent of the absorbed pump power. The optical pump power can therefore advantageously be varied without the peak wavelength changing significantly. This is particularly advantageous if the radiation to be amplified by the semiconductor body is provided for frequency conversion by means of a nonlinear-optical element since such a conversion is only efficient for a very narrow spectral range. A change in the peak wavelength could therefore lead disadvantageously to a less efficient nonlinear-optical frequency conversion.

For the optical pumping of lasers, too, a stable peak wavelength is particularly advantageous since the peak wavelength of the radiation emitted by the semiconductor body can be set optimally to the absorption maximum of the laser to be pumped, independently of the pump power with which the semiconductor body is pumped.

Figure 7:
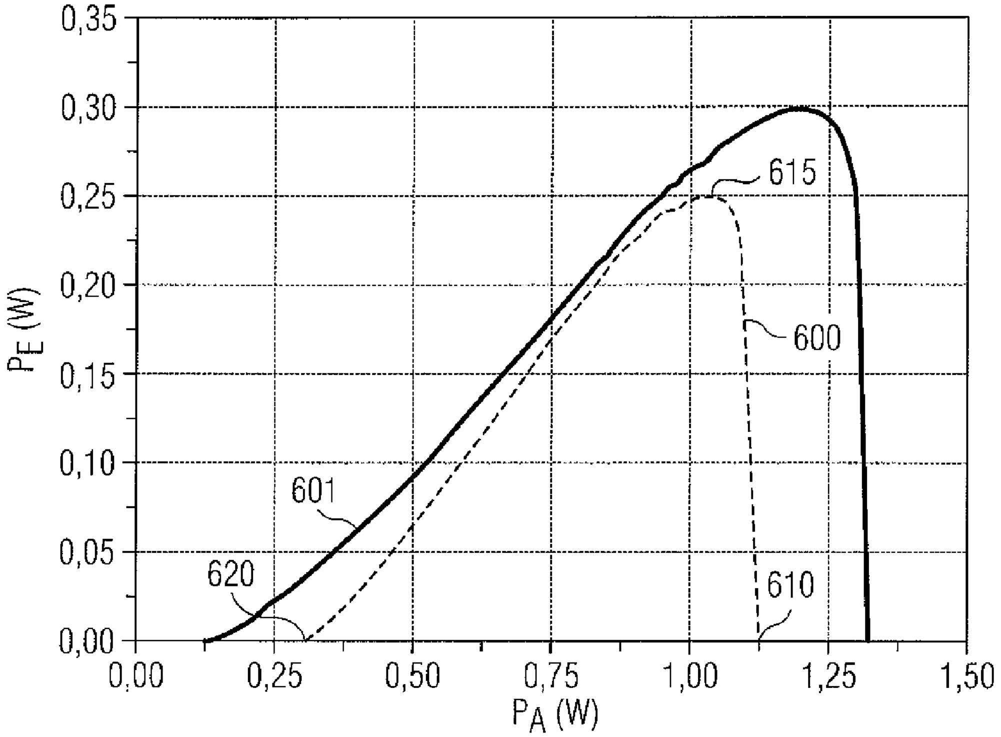
FIG. 7 shows a result of a measurement of a radiation power $P_E$ emitted by a semiconductor body according to the invention as a function of the absorbed pump power $P_A$ in comparison with a result of the corresponding measurement at a conventional semiconductor body.

It should be pointed out once again that no further measures for wavelength stabilization were implemented when carrying out the measurements whose results are shown in FIGS. 5 and 7. In particular no countercompensation of the rise in the temperature of the active region was effected by lowering the temperature of the heat sink. Moreover, no additional element, usually provided for frequency stabilization, was arranged in the resonator, in particular outside the semiconductor body. Since the illustrated measurements at the semiconductor body according to the invention and the conventional semiconductor body were carried out under identical experimental conditions, the measurements prove that the semiconductor body is embodied in wavelength-stabilizing fashion in such a way that the dependence of the peak wavelength on the temperature of the active region is greatly reduced.

Figure 6B:
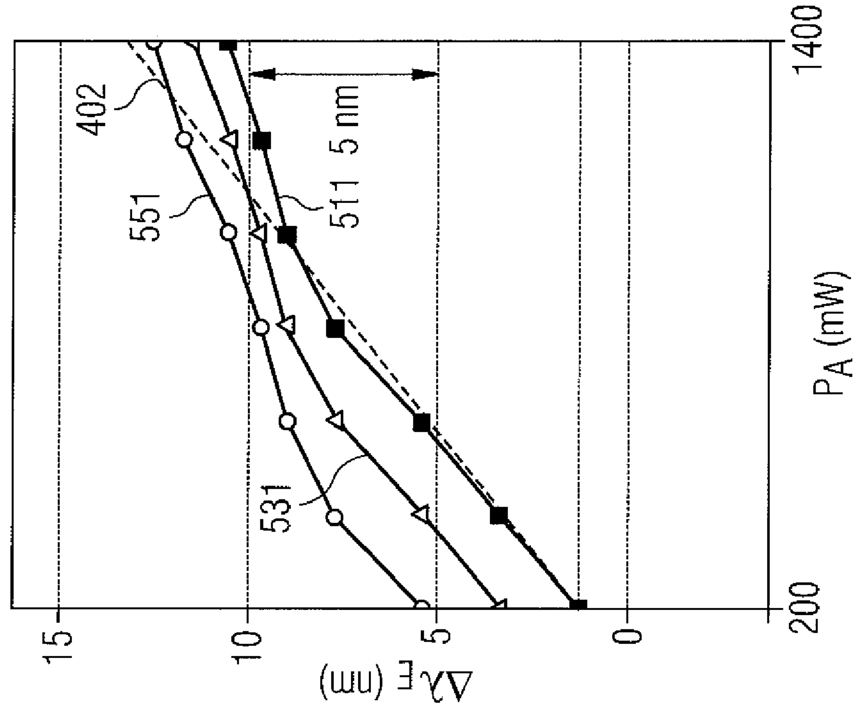
FIG. 6B shows a corresponding simulated profile for a conventional semiconductor body.
Figure 6A:
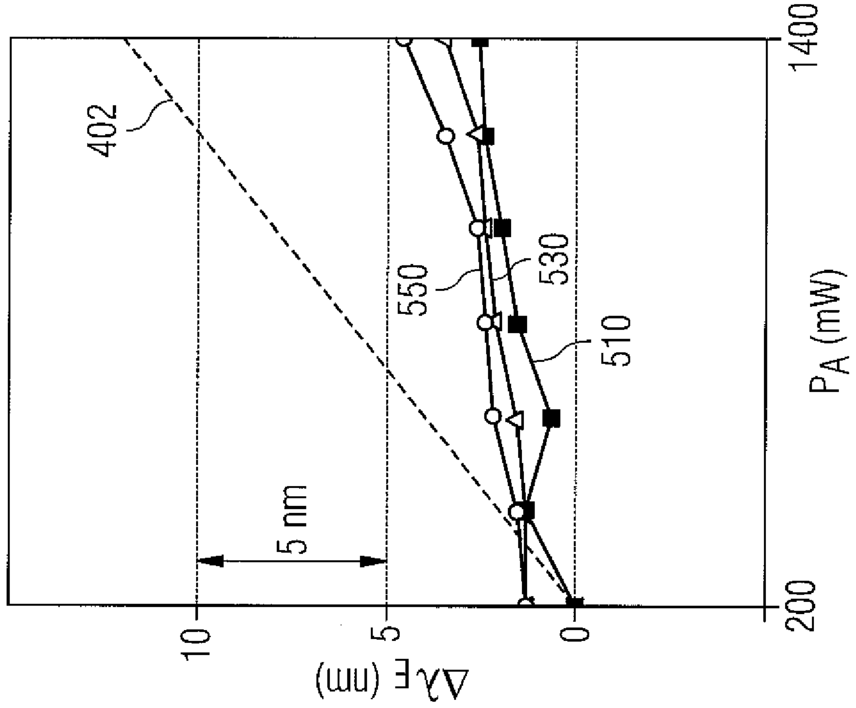
FIG. 6A shows a simulated profile of the change in the peak wavelength $\Delta\lambda_E$ of the radiation generated during operation in a semiconductor body according to the invention as a function of the absorbed pump power $P_A$.

FIGS. 6A and 6B show what changes in the peak wavelength $\lambda_E$ with the absorbed pump power $P_A$ are to be expected for the semiconductor bodies on which the measurements shown in FIG. 5 are carried out, in accordance with a theoretical model. In this case, FIG. 6A shows a simulation for the semiconductor body according to the invention for three different temperatures of the heat sink, wherein a curve 510 is based on a temperature of 10° C., a curve 530 is based on a temperature of 30° C. and a curve 550 is based on a temperature of 50° C. FIG. 6B correspondingly shows simulations for a conventional semiconductor body, wherein a curve 511 is based on a temperature of 10° C., a curve 531 is based on a temperature of 30° C. and a curve 551 is based on a temperature of 50° C.

For comparison, in both FIGS. 6A and 6B the curve 402 once again shows a continuous increase in the peak wavelength with the absorbed pump power with a constant gradient of 10 nm/W and 0.1 nm/K, respectively.

For the conventional semiconductor body, all the curves rise continuously. At low absorbed powers, for instance between 200 mW and 400 mW, the gradient of the curves 511, 531 and 551 in this case corresponds approximately to that of the curve 402. Moreover, in this range, the peak wavelength rises with the temperature of the heat sink, wherein this change likewise amounts to approximately 0.1 nm/K.

For the semiconductor body according to the invention, a rise in the peak wavelength with the absorbed pump power is likewise to be expected in accordance with the curves 510, 530 and 550 for all temperatures of the heat sink. However, the rise is considerably smaller. The absolute change in the peak wavelength in the illustrated range of the absorbed pump power is in this case significantly less than 4 nm for all the curves, whereas this change amounts to more than 7 nm for all the curves in the conventional semiconductor body. The dependence of the peak wavelength on the temperature of the heat sink is also significantly reduced for the semiconductor body according to the invention.

The effect of a reduced dependence of the peak wavelength on the temperature of the active region by means of a targeted detuning of layer thicknesses of semiconductor layers arranged outside the active region can therefore also be confirmed by the simulations shown.

FIG. 7 illustrates, for the semiconductor bodies at which the measurements shown in FIG. 5 are carried out, the output power $P_E$ emitted by the semiconductor body as a function of the absorbed pump power. In this case, a curve 600 shows the result of a measurement at the semiconductor body according to the invention and a curve 601 shows the result of a measurement at the conventional semiconductor body. The laser activity commences at a laser threshold 620. In a range around the operating point of the maximum output power 615, that is to say in the range around approximately 1 W, the output power during operation of the semiconductor body according to the invention, with more than 0.24 W, lies only approximately 10% below the output power during operation of the conventional semiconductor body, which achieves an output power of somewhat more than 0.26 W for the same absorbed pump power. Above approximately 1.1 W, the upper limit of the laser activity 610 is reached in the semiconductor body according to the invention. The reason for this is the thermal roll-over of the semiconductor body.

Accordingly, it is possible, by means of targeted detuning of layer thicknesses of semiconductor layers arranged outside the active region, to embody a semiconductor body in wavelength-stabilizing fashion in such a way that the peak wavelength of the radiation to be amplified during the operation of the semiconductor body changes only insignificantly in the event of a change in the temperature of the active region, without the output power decreasing greatly, for instance by 20% or more, in the case of a specific absorbed pump power in comparison with that of a conventional semiconductor body.

The dependence of the peak wavelength on the temperature of the active region was shown merely by way of example for optical pumping in FIGS. 5 to 7. Such a stabilization of the peak wavelength with respect to changes in the temperature of the active region can also be obtained in the case of an electrically pumped semiconductor body embodied according to the invention.

Figure 8:
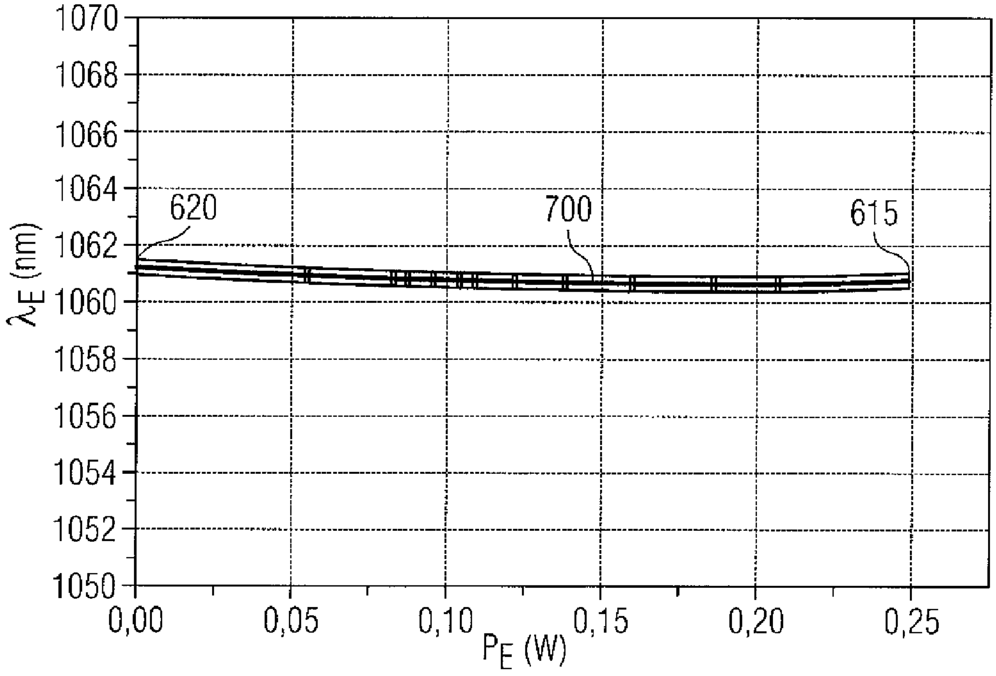
FIG. 8 shows a result of a measurement of the peak wavelength $\lambda_E$ of the radiation generated in the active region as a function of the output power $P_E$ thereof.

In FIG. 8, the symbols 700 show the result of a measurement of the peak wavelength $\lambda_E$ of the radiation generated in the active region as a function of the output power $P_E$ of the radiation generated in the active region of a semiconductor body according to the invention during operation in a resonator. In this case, the output power is plotted over the entire operating range in which the semiconductor body exhibits laser activity. Said laser activity commences at the laser threshold 620. A maximum output power 615 is determined by the thermal roll-over of the semiconductor body according to the invention.

The fluctuation of the peak wavelength is ±0.3 nm over the entire operating range. Accordingly, the semiconductor body is embodied in wavelength-stabilized fashion in such a way that the peak wavelength changes by significantly less than 1 nm over the entire range of the laser activity of the semiconductor body.

As explained in connection with the description of FIGS. 5 and 7, no further measures for wavelength stabilization were implemented when carrying out the measurements shown in FIG. 8 either.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or the exemplary embodiments.

The invention claimed is:

1. A surface emitting semiconductor body with a vertical emission direction, which is provided for operation with a resonator and comprises a semiconductor layer sequence with an active region and also at least two semiconductor layers arranged outside the active region, wherein:

the active region comprises a plurality of quantum structures, a geometrical midpoint is assigned to each quantum structure with regard to its extent along the emission direction, the geometrical midpoints of the quantum structures, along the emission direction, are arranged at a mean optical distance D with respect to one another, an optical layer thickness of one of the semiconductor layers arranged outside the active region is detuned in targeted fashion with respect to an integer multiple of half the mean optical distance D, the resonator is formed by means of a Bragg mirror formed in the semiconductor body, and the Bragg mirror is formed with one of the semiconductor layers that are arranged outside the active region and detuned in targeted fashion.

2. The surface emitting semiconductor body as claimed in claim 1, wherein the semiconductor body is embodied in wavelength-stabilizing fashion in such a way that during operation of the semiconductor body in a resonator, a peak wavelength of a radiation generated in the active region, in a predetermined operating range, is stabilized with respect to a change in the output power of the radiation generated in the active region.

3. The surface emitting semiconductor body as claimed in claim 2, wherein a lower limit of the predetermined operating range is formed by a laser threshold of the surface emitting semiconductor body.

4. The surface emitting semiconductor body as claimed in claim 2, wherein an upper limit of the predetermined operating range is formed by an upper limit of the laser activity of the surface emitting semiconductor body.

5. The surface emitting semiconductor body as claimed in claim 2, wherein the predetermined operating range is formed by the entire range of the laser activity of the surface emitting semiconductor body.

6. The surface emitting semiconductor body as claimed in claim 2, wherein the peak wavelength of the radiation generated in the active region changes by 10 nm or less in the predetermined operating range.

7. The surface emitting semiconductor body as claimed in claim 2, wherein the peak wavelength of the radiation generated in the active region changes by 5 nm or less in the predetermined operating range.

8. The surface emitting semiconductor body as claimed in claim 2, wherein the peak wavelength of the radiation generated in the active region changes by 1 nm or less in the predetermined operating range.

9. The surface emitting semiconductor body as claimed in claim 1, wherein the optical layer thickness of one of the semiconductor layers arranged outside the active region is detuned with respect to an odd-numbered multiple D/2 relative to D/2 or with respect to an integer multiple of D relative to D by an amount which is greater than or equal to 1% and less than or equal to 45%.

10. The surface emitting semiconductor body as claimed in claim 1, wherein the optical layer thickness of one of the semiconductor layers arranged outside the active region is detuned with respect to an odd-numbered multiple D/2 relative to D/2 or with respect to an integer multiple of D relative to D by an amount which is greater than or equal to 2% and less than or equal to 35%.

11. The surface emitting semiconductor body as claimed in claim 1, wherein the optical layer thickness of one of the semiconductor layers arranged outside the active region is detuned with respect to an odd-numbered multiple D/2 relative to D/2 or with respect to an integer multiple of D relative to D by an amount which is greater than or equal to 5% and less than or equal to 30%.

12. The surface emitting semiconductor body as claimed in claim 1, wherein the active region is arranged between the semiconductor layers arranged outside the active region.

13. The surface emitting semiconductor body as claimed in claim 1, wherein both semiconductor layers arranged outside the active region are detuned in targeted fashion with respect to an integer multiple of D or with respect to an odd-numbered multiple of D/2.

14. The surface emitting semiconductor body as claimed in claim 1, wherein one of the semiconductor layers arranged outside the active region is larger than an integer multiple of D/2 and one of the semiconductor layers arranged outside the active region is smaller than an integer multiple of D/2.

15. The surface emitting semiconductor body as claimed in claim 1, wherein the Bragg mirror comprises further semiconductor layers that are detuned in targeted fashion with respect to an odd-numbered multiple of D/2.

16. The surface emitting semiconductor body as claimed in claim 1, wherein the semiconductor body comprises a radiation passage area for radiation to be amplified in the active region.

17. The surface emitting semiconductor body as claimed in claim 1, wherein one of the semiconductor layers that are arranged outside the active region and detuned in targeted fashion is embodied as a window layer adjoining the radiation passage area.

18. The surface emitting semiconductor body as claimed in claim 17, wherein a further semiconductor layer is arranged between the window layer and the active region.

19. The surface emitting semiconductor body as claimed in claim 1, wherein the optical layer thicknesses of the semiconductor layers arranged between the active region and a radiation passage area are detuned with respect to an integer multiple of D relative to D by an amount which is greater than or equal to 1% and less than or equal to 45%.

20. The surface emitting semiconductor body as claimed in claim 1, wherein the optical layer thicknesses of the semiconductor layers arranged on that side of the active region which is remote from a radiation passage area are detuned with respect to D/2 by an amount which is greater than or equal to 1% and less than or equal to 45%.

21. The surface emitting semiconductor body as claimed in claim 1, wherein the active region comprises at least five quantum structures.

22. The surface emitting semiconductor body as claimed in claim 1, wherein two adjacent quantum structures are separated from one another by a barrier.

23. The surface emitting semiconductor body as claimed in claim 22, wherein the barrier contains $GaAs_{1-y}P_y$, where $0 \leqq y \leqq 1$, or $Al_zGa_{1-z}As$, where $0 \leqq z \leqq 1$.

24. The surface emitting semiconductor body as claimed in claim 1, wherein a quantum structure is formed by a quantum layer.

25. The surface emitting semiconductor body as claimed in claim 1, wherein a quantum structure comprises between 2 and 5 quantum layers inclusive, wherein the quantum layers within the quantum structure are separated from one another by interlayers.

26. The surface emitting semiconductor body as claimed in claim 1, wherein a quantum structure contains $In_xGa_{1-x}As$ where $0 \leqq x \leqq 1$.

27. The surface emitting semiconductor body as claimed in claim 1, wherein the resonator is embodied as an external resonator.

28. The surface emitting semiconductor body as claimed in claim 27, wherein an optical beam path in the external resonator outside the semiconductor body is free of mode-selecting elements.

29. The surface emitting semiconductor body as claimed in claim 1, wherein the semiconductor body is embodied in wavelength-stabilizing fashion in such a way that during its operation in the resonator the peak wavelength of the radiation to be amplified in the active region changes by 0.5%/100K or less in the event of a change in the temperature of the active region.

30. The surface emitting semiconductor body as claimed in claim 1, wherein the semiconductor body is embodied in such a way that during its operation in the resonator the peak wavelength of the radiation to be amplified in the active region changes by 0.2%/100K or less.

31. The surface emitting semiconductor body as claimed in claim 1, wherein a nonlinear-optical element is arranged in the resonator.

32. The surface emitting semiconductor body as claimed in claim 31, wherein the nonlinear-optical element is provided for frequency multiplication of the radiation to be amplified in the active region.

33. The surface emitting semiconductor body as claimed in claim 1, wherein the semiconductor body is embodied for optical pumping of the active region by a pump radiation source.

34. The surface emitting semiconductor body as claimed in claim 33, wherein the semiconductor body is embodied in wavelength-stabilizing fashion in such a way that the peak wavelength of the radiation to be amplified in the active region of the semiconductor body changes by 5 nm/W or less in the event of a change in an optical pump power absorbed in the active region.

35. The surface emitting semiconductor body as claimed in claim 33, wherein the pump radiation source is provided for lateral pumping of the semiconductor body.

36. The surface emitting semiconductor body as claimed in claim 33, wherein the pump radiation source and the semiconductor body are monolithically integrated.

37. A semiconductor laser component comprising a surface emitting semiconductor body as claimed in claim 1 and a resonator.

38. The semiconductor laser component as claimed in claim 37, wherein the semiconductor laser component is provided for optically pumping a laser.

39. The semiconductor laser component as claimed in claim 38, wherein the laser is solid-state laser, a fiber laser or a semiconductor laser.

40. The semiconductor laser component as claimed in claim 37, wherein the semiconductor laser component is provided for operation in a display device, in particular a projection arrangement.

41. The surface emitting semiconductor body as claimed in claim 1, wherein the optical layer thicknesses of the semiconductor layers arranged between the active region and a radiation passage area are detuned with respect to an integer multiple of D relative to D by an amount which is greater than or equal to 2% and less than or equal to 35%.

42. The surface emitting semiconductor body as claimed in claim 1, wherein the optical layer thicknesses of the semiconductor layers arranged between the active region and a radiation passage area are detuned with respect to an integer multiple of D relative to D by an amount which is greater than or equal to 5% and less than or equal to 30%.

43. The surface emitting semiconductor body as claimed in claim 1, wherein the optical layer thicknesses of the semiconductor layers arranged on that side of the active region which is remote from a radiation passage area are detuned with respect to D/2 by an amount which is greater than or equal to 2% and less than or equal to 35%.

44. The surface emitting semiconductor body as claimed in claim 1, wherein the optical layer thicknesses of the semiconductor layers arranged on that side of the active region which is remote from a radiation passage area are detuned with respect to D/2 by an amount which is greater than or equal to 5% and less than or equal to 30%.

45. A surface emitting semiconductor body with a vertical emission direction, which is provided for operation with a resonator and comprises a semiconductor layer sequence with an active region and also at least two semiconductor layers arranged outside the active region, wherein:

the active region comprises a plurality of quantum structures, a geometrical midpoint is assigned to each quantum structure with regard to its extent along the emission direction, the geometrical midpoints of the quantum structures, along the emission direction, are arranged at a mean optical distance D with respect to one another, an optical layer thickness of one of the semiconductor layers arranged outside the active region is detuned in targeted fashion with respect to an integer multiple of half the mean optical distance D, and both semiconductor layers arranged outside the active region are detuned in targeted fashion with respect to an integer multiple of D or with respect to an odd-numbered multiple of D/2.

46. A surface emitting semiconductor body with a vertical emission direction, which is provided for operation with a resonator and comprises a semiconductor layer sequence with an active region and also at least two semiconductor layers arranged outside the active region, wherein:

the active region comprises a plurality of quantum structures, a geometrical midpoint is assigned to each quantum structure with regard to its extent along the emission direction, the geometrical midpoints of the quantum structures, along the emission direction, are arranged at a mean optical distance D with respect to one another, an optical layer thickness of one of the semiconductor layers arranged outside the active region is detuned in targeted fashion with respect to an integer multiple of half the mean optical distance D, the semiconductor body comprises a radiation passage area for radiation to be amplified in the active region, and one of the semiconductor layers that are arranged outside the active region and detuned in targeted fashion is embodied as a window layer adjoining the radiation passage area.

47. A surface emitting semiconductor body with a vertical emission direction, which is provided for operation with a resonator and comprises a semiconductor layer sequence with an active region and also at least two semiconductor layers arranged outside the active region, wherein:

the active region comprises a plurality of quantum structures, a geometrical midpoint is assigned to each quantum structure with regard to its extent along the emission direction, the geometrical midpoints of the quantum structures, along the emission direction, are arranged at a mean optical distance D with respect to one another, an optical layer thickness of one of the semiconductor layers arranged outside the active region is detuned in targeted fashion with respect to an integer multiple of half the mean optical distance D, the semiconductor body is embodied for optical pumping of the active region by a pump radiation source, and the semiconductor body is embodied in wavelength-stabilizing fashion in such a way that the peak wavelength of the radiation to be amplified in the active region of the semiconductor body changes by 5 nm/W or less in the event of a change in an optical pump power absorbed in the active region.

* * * * *